(12) United States Patent
Fukuta

(10) Patent No.: US 7,187,171 B2
(45) Date of Patent: Mar. 6, 2007

(54) MAGNETIC RESONANCE IMAGING APPARATUS AND ITS CONTROL METHOD

(75) Inventor: Toshio Fukuta, Otawara (JP)

(73) Assignees: Kaburhiki Kaisha Toshiba, Tokyo (JP); Toshiba Medical Systems Corporation, Otawara (JP)

( * ) Notice: Subject to any disclaimer, the term of this patent is extended or adjusted under 35 U.S.C. 154(b) by 0 days.

(21) Appl. No.: 11/349,284

(22) Filed: Feb. 8, 2006

(65) Prior Publication Data

US 2006/0176055 A1    Aug. 10, 2006

(30) Foreign Application Priority Data

Feb. 10, 2005    (JP) .............................. 2005-034513

(51) Int. Cl.
    *G01V 3/00*    (2006.01)
(52) U.S. Cl. ..................................................... 324/307
(58) Field of Classification Search ................. 324/307
    See application file for complete search history.

(56) References Cited

U.S. PATENT DOCUMENTS 5,818,229 A    10/1998    Kanazawa 6,160,397 A *  12/2000    Washburn et al. .......... 324/309
6,369,568 B1    4/2002    Ma et al.
2002/0047708 A1*  4/2002    Miyoshi et al. ............. 324/307

OTHER PUBLICATIONS

Crawley et al., "Errors in T2 Estimation Using Multislice Multiple-Echo Imaging", Magnetic Resonance in Medicine 4, pp. 34-47, 1987.

* cited by examiner

*Primary Examiner*—Diego Gutierrez
*Assistant Examiner*—Megann E. Vaughn
(74) *Attorney, Agent, or Firm*—Nixon & Vanderhye P.C.

(57) ABSTRACT

Collecting first and second echoes and third or fourth echoes, controlling a unit to supply a coil with a base pulse during a period of collecting the echoes, and to further supply the coil with a unit pulse before the period of collecting the third or fourth echoes, measuring an amount of deviation of a peak position of the second echo from a peak position of the first echo, measuring an amount of shift of a peak position of the third or fourth echoes from the peak position of the first or second echoes, determining a correction energy based on the amount of shift, an energy of the unit pulse, and the amount of deviation, and controlling, during the actual scanning, the unit to supply the coil with the base pulse, and to further supply the coil with a correction pulse of the determined correction energy.

9 Claims, 4 Drawing Sheets

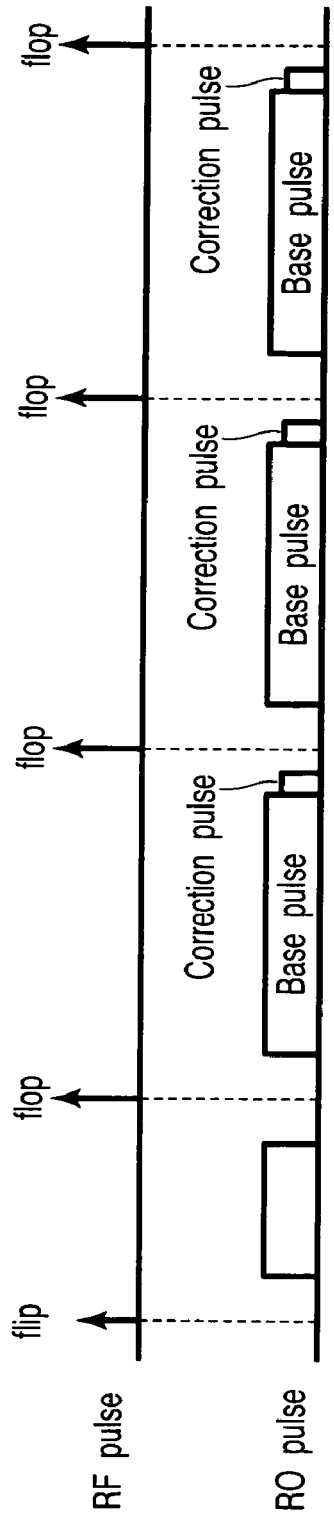
F I G. 5
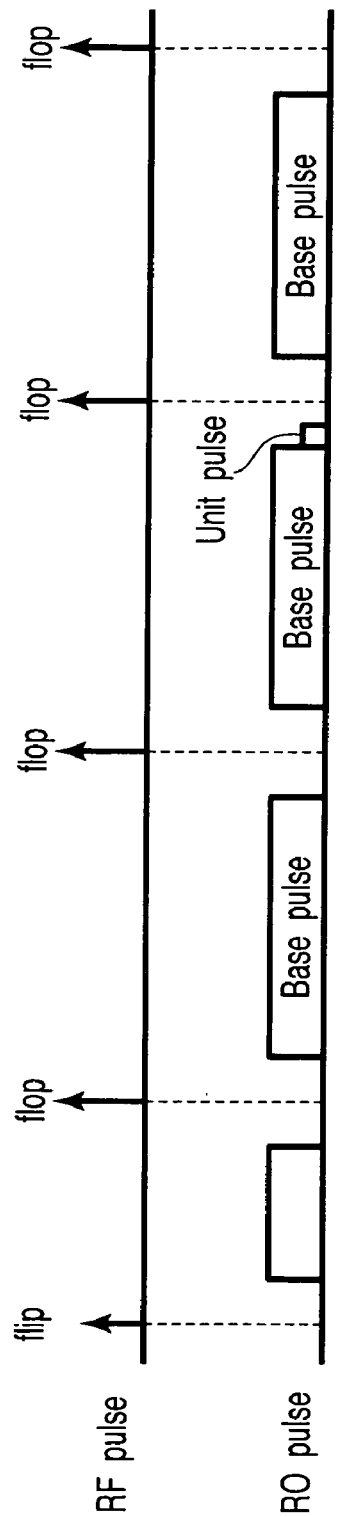
F I G. 6

MAGNETIC RESONANCE IMAGING APPARATUS AND ITS CONTROL METHOD

CROSS-REFERENCE TO RELATED APPLICATIONS

This application is based upon and claims the benefit of priority from prior Japanese Patent Application No. 2005-034513, filed Feb. 10, 2005, the entire contents of which are incorporated herein by reference.

BACKGROUND OF THE INVENTION

1. Field of the Invention

The present invention relates to a magnetic resonance imaging (MRI) apparatus and its control method, utilizing fast spin echo (FSE) method.

2. Description of the Related Art

In magnetic resonance imaging apparatuses of this type, phase lags of spin echoes are detected by pre-scanning. In actual scanning, the detected phase lags are corrected.

For instance, U.S. Pat. No. 6,369,568 discloses a technique, in which spin echoes without phase encodes (PE) are collected, and the $0^{th}$- and $1^{st}$-order phase differences between the $1^{st}$ and $2^{nd}$ echoes are measured. The $0^{th}$-order phase difference is mainly corrected using an RF phase, and the $1^{st}$-order phase difference is corrected by adding a correction pulse to a gradient magnetic field pulse in the readout direction.

The level of the correction pulse is theoretically determined utilizing, for example, a substantially trapezoidal model. However, a change in gradient magnetic field may vary because of the influence of eddy currents or vibration, even if a preset correction pulse is added. In particular, a gradient magnetic coil of a non-shield type and/or open-type magnet is significantly influenced by eddy currents or vibration, and considerable variations are found in the area of the gradient magnetic field.

Accordingly, when a correction pulse uniquely determined from a measured phase difference is used, the phase difference may not completely be corrected. The remaining phase difference may cause variations in reception level.

BRIEF SUMMARY OF THE INVENTION

In light of the above, there is a need for accurate correction of a $1^{st}$-order phase difference.

According to a first aspect of the present invention, there is provided a magnetic resonance imaging apparatus for imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising: a collection unit configured to collect, before actual scanning for collecting data used for imaging, a first spin echo, a second spin echo, and one of a third echo and a fourth echo occurring after the first and second spin echoes, each of the first and third spin echoes being an $n^{th}$ (n is a positive odd number) spin echo, each of the second and fourth spin echoes being an $m^{th}$ (m is a positive even number) spin echo; a first control unit configured to control the supply unit to supply the gradient magnetic field coil with a base pulse as the readout pulse during a period of collecting by the collection unit, spin echoes including the first to fourth spin echoes, and to supply the gradient magnetic field coil with a unit pulse as the readout pulse during a period ranging from an end of a period of collecting a spin echo, which is included in the spin echoes and occurs immediately before one of the third and fourth spin echoes, to a start of a period of collecting one of the third and fourth spin echoes; a first measurement unit configured to measure an amount of deviation of a peak position of the second spin echo from a peak position of the first spin echo; a second measurement unit configured to measure an amount of shift of a peak position of the third spin echo from the peak position of the first spin echo, or an amount of shift of a peak position of the fourth spin echo from the peak position of the second spin echo; a determination unit configured to determine an amount of correction energy for correcting the shift of the peak position of the second spin echo from the peak position of the first spin echo, based on the amount of shift, an amount of energy of the unit pulse, and the amount of deviation; and a second control unit configured to control the supply unit to supply the gradient magnetic field coil with the base pulse as the readout pulse during the actual scanning, and to further supply the gradient magnetic field coil with a correction pulse of the determined amount of correction energy as the readout pulse during the actual scanning.

According to a second aspect of the present invention, there is provided a control method for use in a magnetic resonance imaging apparatus for performing imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising: collecting, before actual scanning for collecting data used for imaging, a first spin echo, a second spin echo, and one of a third echo and a fourth echo occurring after the first and second spin echoes, each of the first and third spin echoes being an $n^{th}$ (n is a positive odd number) spin echo, each of the second and fourth spin echoes being an $m^{th}$ (m is a positive even number) spin echo; controlling the supply unit to supply the gradient magnetic field coil with a base pulse as the readout pulse during a period of collecting the echoes, spin echoes including the first to fourth spin echoes, and to supply the gradient magnetic field coil with a unit pulse as the readout pulse during a period ranging from an end of a period of collecting a spin echo, which is included in the spin echoes and occurs immediately before one of the third and fourth spin echoes, to a start of a period of collecting one of the third and fourth spin echoes; measuring an amount of deviation of a peak position of the second spin echo from a peak position of the first spin echo; measuring an amount of shift of a peak position of the third spin echo from the peak position of the first spin echo, or an amount of shift of a peak position of the fourth spin echo from the peak position of the second spin echo; determining an amount of correction energy for correcting the shift of the peak position of the second spin echo from the peak position of the first spin echo, based on the amount of shift, an amount of energy of the unit pulse, and the amount of deviation; and controlling the supply unit to supply the gradient magnetic field coil with the base pulse as the readout pulse during the actual scanning, and to further supply the gradient magnetic field coil with a correction pulse of the determined amount of correction energy as the readout pulse during the actual scanning.

According to a third aspect of the present invention, there is provided a control method for use in a magnetic resonance imaging apparatus for performing imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising: determining, before actual scanning for collecting data used for imaging, a level of a correction pulse used during the actual scanning, based on a spin echo acquired in the gradient magnetic field acquired using a base pulse as the readout pulse, and a spin echo acquired in the gradient magnetic field acquired using a pulse acquired by adding a unit pulse to the base pulse as the readout signal; acquiring, during the actual scanning, a spin echo in the gradient magnetic field acquired using another pulse, the another pulse being used an the readout pulse and being acquired by adding the correction pulse of the determined level to the base pulse at a same temporal position with respect to an RF pulse as a temporal position of the unit pulse.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 5 is a view illustrating a modification of the correction-pulse addition state; and FIG. 6 is a view illustrating a modification of the unit pulse addition state.

DETAILED DESCRIPTION OF THE INVENTION

An embodiment of the present invention will be explained with reference to the accompanying drawings.

Figure 1:
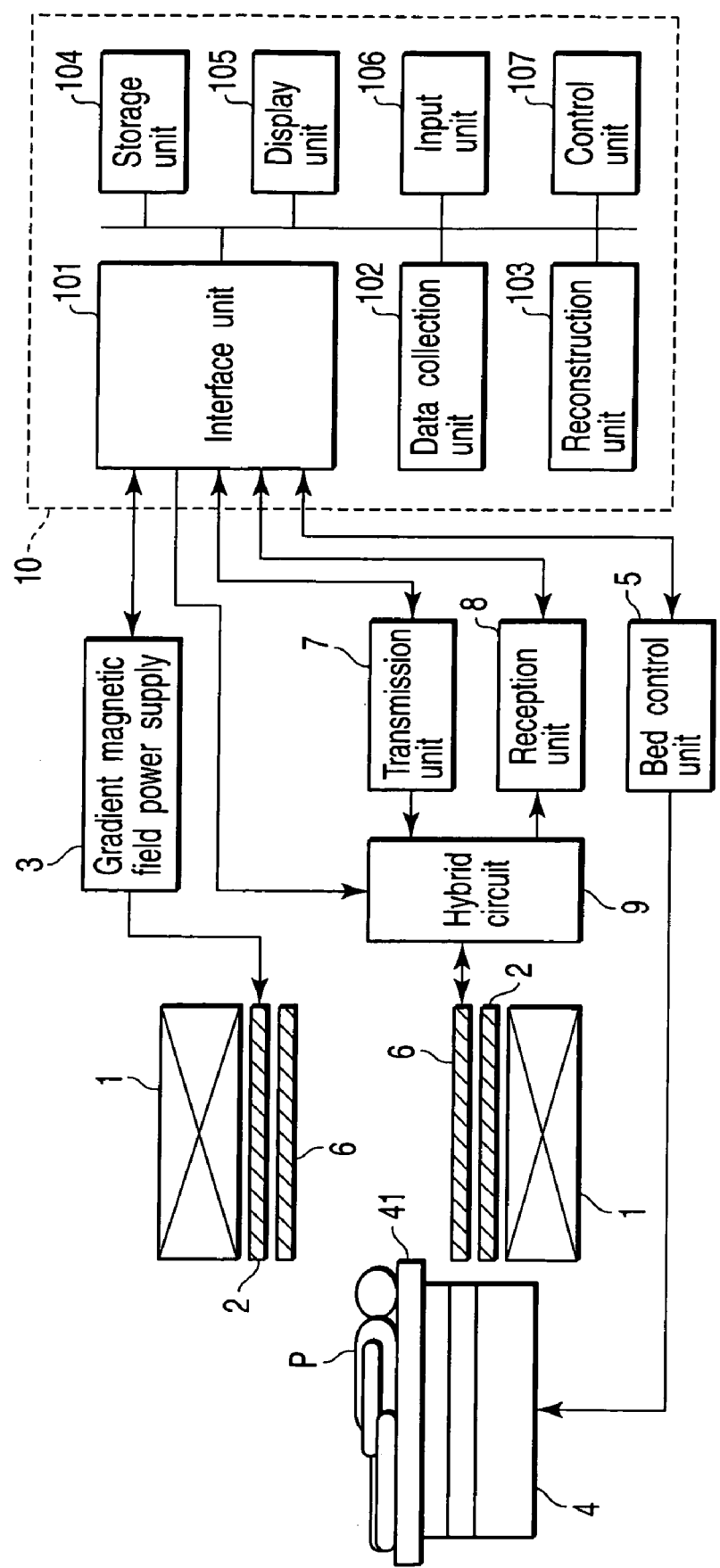
FIG. 1 is a block diagram showing the configuration of a magnetic resonance imaging apparatus according to an embodiment of the present invention.

FIG. 1 is a view showing the configuration of a magnetic resonance imaging apparatus (which will be hereinafter referred to as MRI apparatus) according to the embodiment of the present invention. The MRI apparatus shown in FIG. 1 comprises a static field magnet 1, a gradient magnetic field coil 2, a gradient magnetic field power supply 3, a bed 4, a bed control unit 5, a whole-body RF coil 6, a transmission unit 7, a reception unit 8, a hybrid circuit 9 and a computer system 10.

The static field magnet 1 is hollow and cylindrical, and generates a uniform static magnetic field in its internal space. As the static field magnet 1, for example, a permanent magnet or a superconducting magnet is used.

The gradient magnetic field coil 2 is hollow and cylindrical, and is located inside the static field magnet 1. The gradient magnetic field coil 2 is provided as a set of three coils in connection with X, Y and Z axes perpendicular to each other. When receiving current supplied from the gradient magnetic field power supply 3, the above three coils, i.e., the gradient magnetic field coil 2, generate gradient magnetic fields whose magnetic intensity levels vary in a gradient fashion along the X, Y and Z axes. Suppose the Z direction is the same as the direction in which, e.g., a static magnetic field acts. The gradient magnetic fields at the X, Y and Z axes correspond to, e.g., a slice selection gradient magnetic field Gs, a phase encode gradient magnetic field Ge and a readout gradient magnetic field Gr, respectively. The slice selection gradient magnetic field Gs arbitrarily determines a cross unit to be imaged. The phase encode gradient magnetic field Ge changes the phase of a magnetic resonance signal in accordance with the spatial positions of portions of the gradient magnetic field Ge. The readout gradient magnetic field Gr changes the frequency of the magnetic resonance signal in accordance with the spatial positions.

A patient P to be examined is introduced into a region of space defined by the gradient magnetic field coil 2, while lying on the top 41 of the bed 4. The top 41 is driven by the bed control unit 5 in the longitudinal direction thereof and the vertical direction. Generally, the bed 4 is provided such that the longitudinal direction of the top 41 is parallel to the axis of the static field magnet 1.

The whole-body RF coil 6 is located inside the gradient magnetic field coil 2. The whole-body RF coil 6 receives a high frequency pulse (RF pulse) supplied from the transmission unit 7, and generates a high frequency magnetic field.

The transmission unit 7 incorporates an oscillation unit, a phase selection unit, a frequency conversion unit, an amplitude modulation unit and a high frequency power amplification unit. The oscillation unit produces a high frequency signal having a resonance frequency specific to atomic nuclei to be targeted in the static magnetic field. The phase selection unit selects a phase of the high frequency signal. The frequency conversion unit performs frequency conversion on the high frequency signal output from the phase selection unit. The amplitude modulation unit modulates the amplitude of the high frequency signal output from the frequency conversion unit, in accordance with, e.g., a sync function. The high frequency power amplification unit amplifies the high frequency signal output from the amplitude modulation unit. As a result of the operations of the above units, the transmission unit 7 transmits an RF pulse corresponding to a Larmor frequency.

The whole-body RF coil 6 is located inside the gradient magnetic field coil 2. The whole-body RF coil 6 includes a plurality of RF coils for receiving magnetic resonance signals emitted from the patient P as a result of the influence of the high-frequency magnetic field. The magnetic resonance signals output from the RF coils are input to the reception unit 8.

The reception unit 8 incorporates a pre-stage amplifier, a phase detector and an analog-to-digital converter. The pre-stage amplifier amplifies a magnetic resonance signal output from the hybrid circuit 9. The phase detector detects the phase of a magnetic resonance signal output from the pre-stage amplifier. The analog-to-digital converter converts, into a digital signal, an analog signal output form the phase detector.

During a transmission period, the hybrid circuit 9 supplies the whole-body RF coil 6 with a high-frequency signal output from the transmission unit 7. During a reception period, the hybrid circuit 9 supplies the reception unit 8 with a signal output from the whole-body RF coil 6. The transmission and reception periods are designated by the computer system 10. Further, the hybrid circuit 9 can be connected to a local RF coil. When the hybrid circuit 9 is connected to a local RF coil, it supplies a high-frequency pulse to the whole-body RF coil or local RF coil, and supplies the reception unit 8 with the output of the whole-body RF coil or of local RF coil. Whether the whole-body RF coil or local RF coil is selected is designated by the computer system 10.

The computer system 10 includes an interface unit 101, a data collection unit 102, a reconstruction unit 103, a storage unit 104, a display unit 105, an input unit 106 and a control unit 107.

To the interface unit 101, the gradient magnetic field power supply 3, the bed control unit 5, the transmission unit 7, the reception unit 8 and the hybrid circuit 9 are connected. The interface unit 101 inputs/outputs a signal to be transmitted between the computer system 10 and each of the gradient magnetic field power supply 3, the bed control unit 5, the transmission unit 7, the reception unit 8 and the hybrid unit 9.

The data collection unit 102 collects the magnetic resonance signal data output from the reception unit 8. The data collection unit 102 stores the collected magnetic resonance signal data in the storage unit 104.

The reconstruction unit 103 performs a post process, i.e., reconstruction processing such as Fourier transform, on the magnetic resonance signal data stored in the storage unit 104 to obtain spectrum data or image data corresponding to a desired nuclear spin in the patient P.

The storage unit 104 stores magnetic resonance signal data, and spectrum data or image data in units of patients.

The display unit 105 displays each of various types of information, such as the spectrum data and the image data, under the control of the control unit 107. As the display unit 105, a liquid crystal display, for example, can be used.

The input unit 106 receives an instruction or information input by an operator. The input unit 106 may be formed of an appropriate one of a pointing device, such as a mouse or a track ball, a selection device, such as a mode switch, and an input device, such as a keyboard.

The control unit 107 includes a CPU and a memory, etc., and takes overall control of the MRI apparatus. Further, the control unit 107 serves as means for realizing the following functions, as well as means for realizing functions that are generally provided in MRI apparatuses. Namely, it executes pre-scanning before actual scanning. It measures phase difference X between the $1^{st}$ and $2^{nd}$ spin echoes acquired by pre-scanning. It controls the gradient magnetic field power supply 3 to cause it to add a unit pulse (for example, which is supposed to shift the echo by one pixel along readout direction if hardware is perfect) of a preset level to a gradient magnetic field pulse (RO pulse) for generating a readout gradient magnetic field that is used to read the $3^{rd}$ spin echo during pre-scanning. It measures phase difference Δ between the $1^{st}$ and $3^{rd}$ spin echoes. It computes the level of a correction pulse for correcting phase difference X based on the level of the unit pulse and phase difference Δ. It controls the gradient magnetic field power supply 3 to cause it to add a correction pulse of the computed level to each RO pulse that generates a gradient magnetic field for reading each spin echo during actual scanning.

A description will be given of the operation of the MRI apparatus constructed as above. Since the operation for acquiring an image of the patient P is similar to the conventional one, no description is given thereof. Only the characterizing operation of the present invention will be described.

The MRI apparatus performs actual scanning using the FSE method. Actual scanning is performed to collect data in k-space for imaging. In the FSE method, a spin echo string is collected by generating a plurality of flop pulses after a single flip pulse. At this time, spin echoes are made to correspond to different lines in the k-space by imparting phase encodes of different levels to the respective spin echoes. Thus, in the FSE method, a plurality of views can be collected by one-time activation.

In the FSE method, if an RF pulse and gradient magnetic field signal, which are repeatedly generated after a flop pulse, each have a symmetrical wave, it is assumed that an MR signal contains two-system echo components, in each of which a first-type spin echo α and second-type spin echo β appear alternately. This assumption is satisfied in many cases. The respective two-system echo components are called a spin echo component and stimulated echo component.

Theoretically, assuming that the phase difference between flip and flop pulses is set to 90°, and the area (moment) ratio of the gradient magnetic field generated for readout after the flip pulse is transmitted, to the gradient magnetic field generated for readout after the flop pulse is transmitted is 1:2, the peak position and the phase at the peak position are identical between the spin echo α in the spin echo component and the spin echo β in the stimulated echo component, and between the spin echo β in the spin echo component and the spin echo α in the stimulated echo component.

However, there is a case where even if an RF pulse with a phase difference of 90° is transmitted to the whole-body RF coil 6, the phase difference between the flip and flop pulses is not 90° due to hardware imperfection and/or 0th order component of eddy current. Further, there is a case where even if a readout pulse (RO pulse) with an area (moment) ratio of 1:2 is supplied to the gradient magnetic field coil 2, the area (moment) ratio of the gradient magnetic field for readout is not 1:2.

In light of the above, before actual scanning, the control unit 107 executes pre-scanning. Pre-scanning is executed to collect data used to determine the phase of the RF pulse for making, 90°, the phase difference between the flip and flop pulses, and to determine the amount of correction to make, 1:2, the area (moment) ratio of the gradient magnetic field. Pre-scanning may be executed to acquire only the data required for those purposes, or to acquire, as well as this data, the data used to determine the amounts of correction for the spoiler pulse or flow compensation pulse.

During pre-scanning, a method for extracting only the spin echo component is employed. A already known method can be used as the method.

For instance, U.S. Pat. No. 5,818,229 discloses a technique for extracting only the spin echo component by adding the signal acquired in the first shot in which the phases of the flop pulses are set to "π, π, π, π, π, π, . . . ," to the signal acquired in the second shot in which the phases of the flop pulses are set to "π, −π, π, −π, π, −π, . . . " Thus, this method requires to collect data by two shots, and to make constant the state of the gradient magnetic field generated after the flop pulse. However, these requirements can be easily satisfied.

Furthermore, "Errors in T2 Estimation Using Multislice Multiple Echo Imaging, Magnetic Resonance in Medicine 4, pp 34–47 (1987) A. P. Crawley and R. M. Henkelman" discloses a method for applying fine pulses of "ΔPE, −ΔPE, 2ΔPE, −2ΔPE, . . . " in a phase-encoding (PE) direction, thereby spoiling the stimulated echo component.

Figure 2:
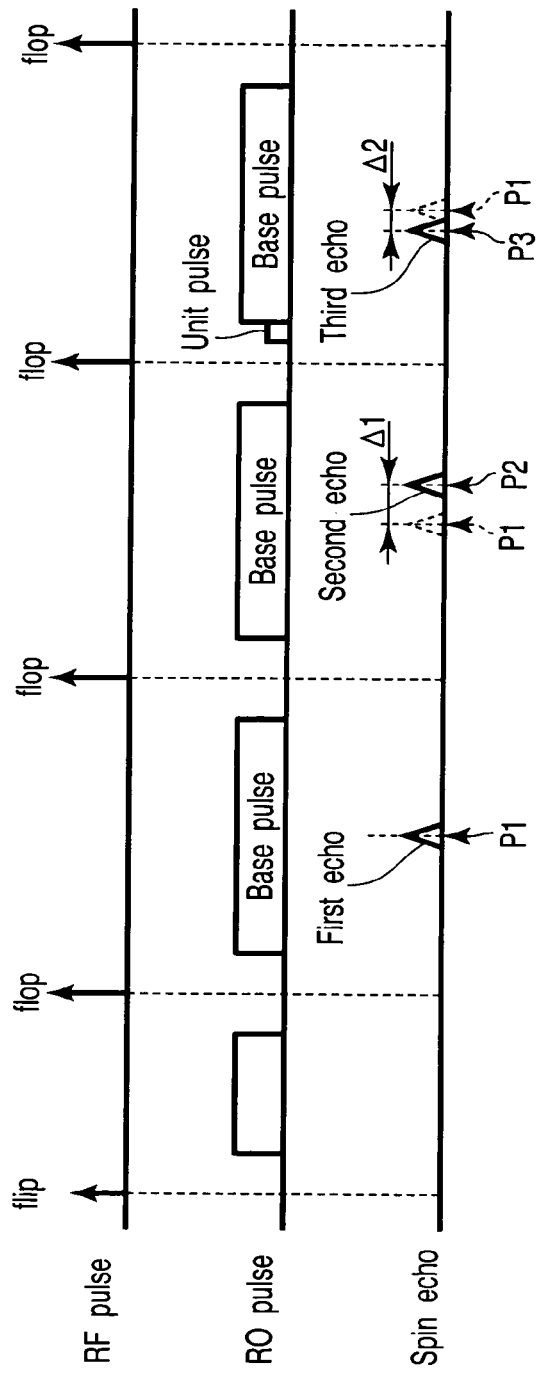
FIG. 2 is a view showing a state in which a unit pulse is added to a readout pulse, and the relationship in the phases of the $1^{st}$ to $3^{rd}$ echoes.

During pre-scanning, if the phase of an RF pulse for transmitting a flip pulse is set to 0°, the phase of the RF pulse for transmitting a flop pulse is set to 90°. As shown in FIG. 2, the RO pulses generated after the first and second flop pulses that are generated after a flip pulse must be base pulses set to have twice the area (moment) of the RO pulse generated after the flip pulse. Further, the RO pulse generated after the third flop pulse is formed of a base pulse with a unit pulse attached to the front portion thereof, as shown in FIG. 2. The unit pulse has a preset area (moment) U. The area (moment) of each RO pulse may be adjusted by the intensity or duration thereof.

Figure 3:
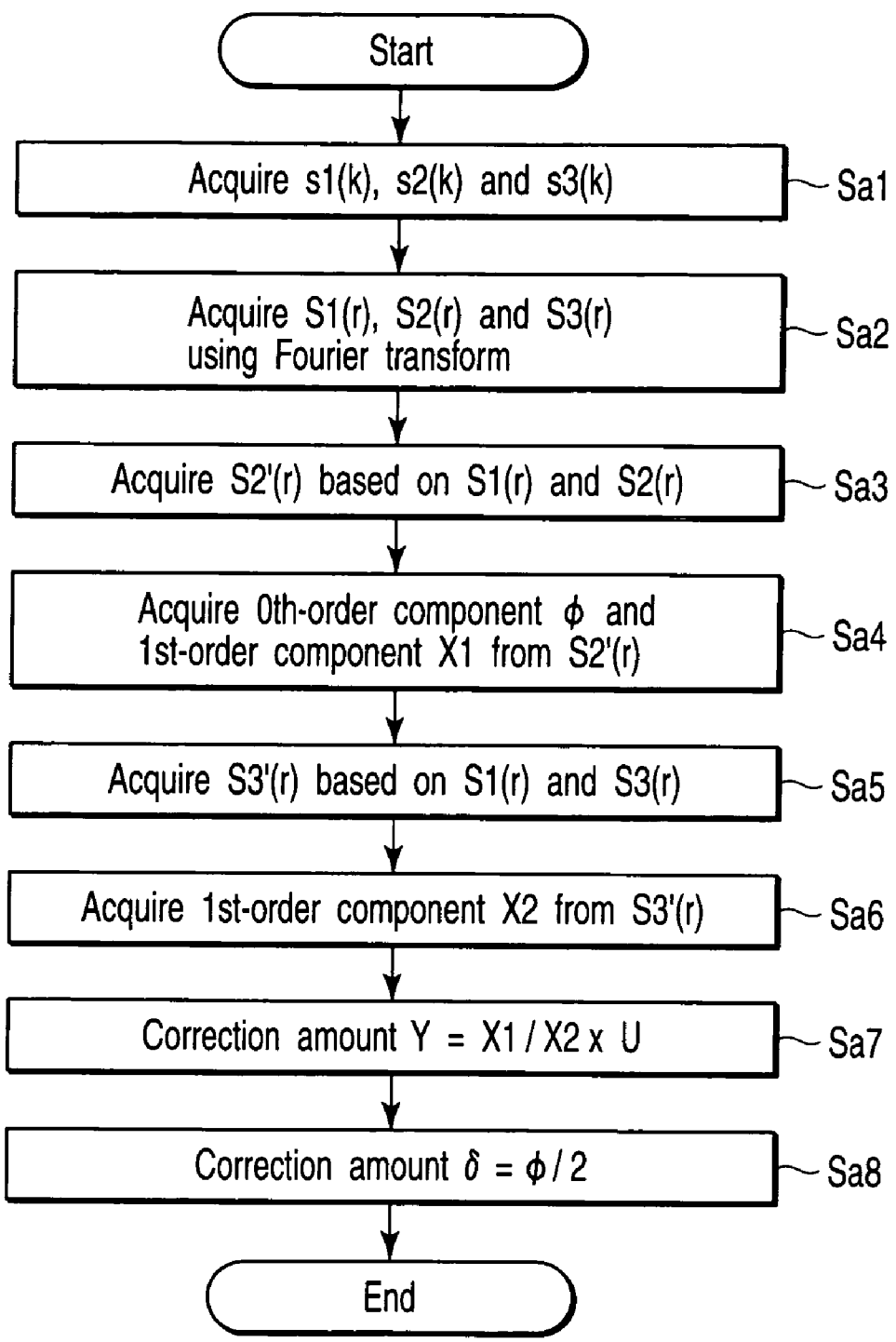
FIG. 3 is a flowchart illustrating a process performed by the controller in FIG. 1 for determining the energy of a correction pulse in actual scanning.

During or after pre-scanning, the control unit 107 executes the process shown in FIG. 3.

Specifically, at step Sa1, the control unit 107 acquires, from the data collected by pre-scanning, first, second and third spin echoes (hereinafter referred to as first, second, and third echoes) s1(k), s2(k) and s3(k). At the next step Sa2, the control unit 107 performs Fourier transform on first, second and third echoes s1(k), s2(k) and s3(k), thereby acquiring transform results S1(r), S2(r) and S3(r).

At step Sa3, the control unit 107 acquires estimation function S2'(r) by subtracting the phase component of S1(r) from S2(r). At step Sa4, the control unit 107 acquires $0^{th}$-order component $\phi$ and $1^{st}$-order component X1 in the readout direction in the phase distribution curve concerning the phase component of S2'(r). To acquire $0^{th}$-order component $\phi$ and $1^{st}$-order component X1, a known method, such as the Ahn method (CB Ahn and ZH Cho, "A new phase correction method in MMR imaging based on autocorrelation and histogram analysis," IEEE Trans. Med. Imag., vol. MI06, pp. 32–36, March 1987), can be utilized.

$1^{st}$-order component X1 acquired at step Sa4 is proportional to amount Δ1 of deviation of peak position P2 of the second echo from that P1 of the first echo, as shown in FIG. 2. Namely, the acquisition of $1^{st}$-order component X1 is equivalent to the measurement of deviation amount Δ1. Further, $0^{th}$-order component $\phi$ is proportional to the difference between the phase of the first echo at peak position P1 and that of the second echo at peak position P2. Namely, the acquisition of $0^{th}$-order component $\phi$ is equivalent to the measurement of the difference between the phase of the first echo at peak position P1 and that of the second echo at peak position P2.

At step Sa5, the control unit 107 acquires estimation function S3'(r) by subtracting the phase component of S1(r) from S3(r). At step Sa6, the control unit 107 acquires $1^{st}$-order component X2 in the readout direction in the phase distribution curve concerning the phase component of S3'(r). To acquire $1^{st}$-order component X2, a known method, such as the previously mentioned Ahn method, can also be utilized.

If RO pulses are all base pulses, the peak position of the third echo is identical to peak position P1 of the first echo. In the case of FIG. 2, however, peak position P3 of the third echo is shifted by amount Δ2 from peak position P1 of the first echo by the influence of a change in the gradient magnetic field due to the unit pulse. Shift amount Δ2 is proportional to $1^{st}$-order component X2 determined at step Sa6. Namely, the acquisition of $1^{st}$-order component X2 is equivalent to the measurement of shift amount Δ2.

The phase difference between the peaks of the first and second echoes, deviation amount Δ1 or shift amount Δ2 can be directly acquired from the echoes that are not subjected to Fourier transform. However, in general, the accuracy of such direct measurement is not sufficient, and measurement based on the $0^{th}$- or $1^{st}$-order component is more appropriate.

At step Sa7, the control unit 107 acquires area (moment) Y of a correction pulse for each RO pulse, using the following equation:

$$Y = X1/X2 \times U$$

At step Sa8, the control unit 107 acquires correction amount δ for the phase of each flop pulse, using the following equation:

$$\delta = \phi/2$$

During actual scanning subsequent to pre-scanning, the control unit 107 controls the transmission unit 7 to shift the phase of each flop pulse by an angle corresponding to correction amount δ. As a result, the phase of the peak of an $n^{th}$ echo (n is an arbitrary positive odd number) becomes substantially identical to that of the peak of an $m^{th}$ echo (m is an arbitrary positive even number). The phase of the peak of an echo can also be corrected by shifting the gradient magnetic field in the slice direction.

Figure 4:
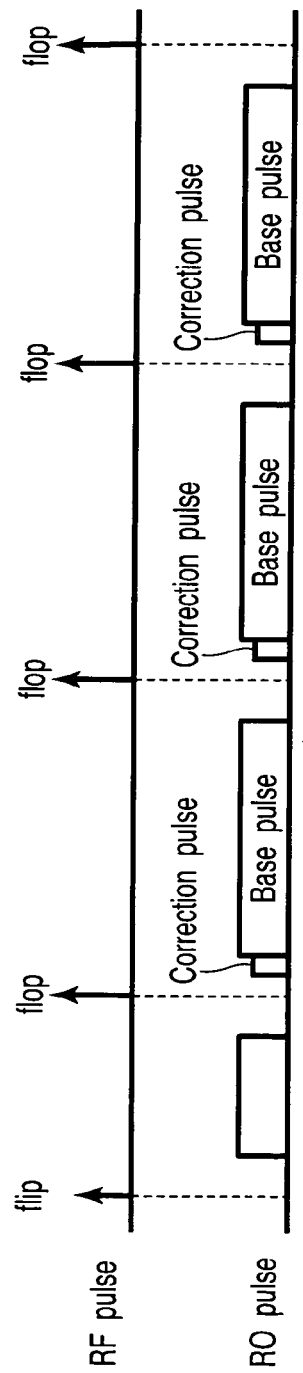
FIG. 4 is a view illustrating a state in which correction pulses are added to readout pulses.

Further, during actual scanning, the control unit 107 controls the gradient magnetic field power supply 3 to apply a correction pulse with area (moment) Y, determined as the above, to each RO pulse for reading the corresponding spin echo, as shown in FIG. 4. The area (moment) of the correction pulse may be adjusted by the intensity or duration thereof. However, note that since a change in duration cannot accurately be adjusted because of the influence of eddy current, it is desirable to adjust the area (moment) of the correction pulse using the intensity thereof. Assume that the position at which the correction pulse is added to each RO pulse is where the unit pulse is added. Namely, in the embodiment, since the unit pulse is added to the front portion of a base pulse as shown in FIG. 2, the correction pulse is also added to the front portion of each base pulse as shown in FIG. 4. The correction pulse may be applied separately from each base pulse.

In addition, when a spoiler pulse or a pulse for flow compensation is added to each base pulse, the area (moment) of such a pulse may be increased by Y.

As described above, in the embodiment, shift amount Δ2 between the peak positions of the third and first pulses read from the gradient magnetic field generated by an RO pulse with a unit pulse is measured, thereby measuring the shift amount of the peak position of the spin pulse due to the unit pulse. Based on the measurement value, the intensity of the correction pulse necessary to correct deviation Δ1 between the peak positions of the first and second pulses is computed. This enables the appropriate intensity of the correction pulse to be computed in light of a change in the gradient magnetic field of the gradient magnetic field coil 2 due to the influence of various conditions, such as eddy current, vibration, etc. The application of the correction pulse of the appropriate intensity to each RO pulse can accurately adjust, to 1:2, the ratio of the area (moment) of the gradient magnetic field of a flip pulse to that of the gradient magnetic field of the first flop pulse, and the ratio between those of the gradient magnetic fields of the second et seq. flop pulses. As a result, reception non-uniformity or ringing can be avoided and highly accurate imaging can be performed.

In general, non-shield-type gradient magnetic field coils and/or open-type magnet are greatly influenced by eddy current or vibration, therefore show significant variations in the area of the gradient magnetic field. The embodiment can appropriately correct such variations. Accordingly, the embodiment is especially advantageous when a non-shield-type coil is used as the gradient magnetic field coil 2.

The embodiment is not limited to the above-described one, but may be modified as follows:

The correction pulse may be added to the rear portion of each base pulse as shown in FIG. 5. In this case, the unit pulse is added to the rear portion of the base pulse for reading the second echo.

Since deviation amount $\Delta 1$ is that between the peak positions of spin echoes $\alpha$ and $\beta$, it is sufficient if the shift amount between the peak positions of an arbitrary $n^{th}$ (n is a positive odd number) spin echo and an arbitrary $m^{th}$ (m is a positive even number) spin echo is measured (for example, the phase difference between the second and third echoes is measured). However, note that no unit pulses are added to the front portion of each base pulse for reading an echo used to measure deviation amount $\Delta 1$.

The unit pulse may be included in a base pulse for reading another $n^{th}$ spin echo. Alternatively, the unit pulse may be included in a base pulse for reading another $m^{th}$ spin echo. However, the unit pulse is added after a base pulse for reading a spin echo used to measure deviation amount $\Delta 1$. Moreover, when the unit pulse is added to a base pulse for reading an $m^{th}$ spin echo, shift amount $\Delta 2$ is measured as the shift amount between the peak positions of this $m^{th}$ spin echo and another $m^{th}$ spin echo used to measure deviation amount $\Delta 1$.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus for imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising:
a collection unit configured to collect, before actual scanning for collecting data used for imaging, a first spin echo, a second spin echo, and one of a third echo and a fourth echo occurring after the first and second spin echoes, each of the first and third spin echoes being an $n^{th}$ (n is a positive odd number) spin echo, each of the second and fourth spin echoes being an $m^{th}$ (m is a positive even number) spin echo;
a first control unit configured to control the supply unit to supply the gradient magnetic field coil with a base pulse as the readout pulse during a period of collecting by the collection unit, spin echoes including the first to fourth spin echoes, and to further supply the gradient magnetic field coil with a unit pulse as the readout pulse during a period ranging from an end of a period of collecting a spin echo, which is included in the spin echoes and occurs immediately before one of the third and fourth spin echoes, to a start of a period of collecting one of the third and fourth spin echoes;
a first measurement unit configured to measure an amount of deviation of a peak position of the second spin echo from a peak position of the first spin echo;
a second measurement unit configured to measure an amount of shift of a peak position of the third spin echo from the peak position of the first spin echo, or an amount of shift of a peak position of the fourth spin echo from the peak position of the second spin echo;
a determination unit configured to determine an amount of correction energy, based on the amount of shift, an amount of energy of the unit pulse, and the amount of deviation; and
a second control unit configured to control the supply unit to supply the gradient magnetic field coil with the base pulse as the readout pulse during the actual scanning, and to further supply the gradient magnetic field coil with a correction pulse of the determined amount of correction energy as the readout pulse during the actual scanning.

2. The magnetic resonance imaging apparatus according to claim 1, wherein:
the first control unit controls the supply unit to add the unit pulse to a front portion of the base pulse during a period of collecting the third spin echo or the fourth spin echo; and
the second control unit controls the supply unit to add the correction pulse to the front portion of the base pulse during the actual scanning.

3. The magnetic resonance imaging apparatus according to claim 1, wherein:
the first control unit controls the supply unit to add the unit pulse to a rear portion of the base pulse during the period of collecting the spin echo which is included in the spin echoes and occurs immediately before one of the third and fourth spin echoes; and
the second control unit controls the supply unit to add the correction pulse to the rear portion of the base pulse during the actual scanning.

4. The magnetic resonance imaging apparatus according to claim 1, wherein:
the collection unit collects the first spin echo, the second spin echo and the third spin echo as spin echoes generated firstly, secondly and thirdly, respectively.

5. A control method for use in a magnetic resonance imaging apparatus for performing imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising:
collecting, before actual scanning for collecting data used for imaging, a first spin echo, a second spin echo, and one of a third echo and a fourth echo occurring after the first and second spin echoes, each of the first and third spin echoes being an $n^{th}$ (n is a positive odd number) spin echo, each of the second and fourth spin echoes being an $m^{th}$ (m is a positive even number) spin echo;
controlling the supply unit to supply the gradient magnetic field coil with a base pulse as the readout pulse during a period of collecting the spin echoes, spin echoes including the first to fourth spin echoes, and to supply the gradient magnetic field coil with a unit pulse as the readout pulse during a period ranging from an end of a period of collecting a spin echo, which is included in the spin echoes and occurs immediately before one of the third and fourth spin echoes, to a start of a period of collecting one of the third and fourth spin echoes;
measuring an amount of deviation of a peak position of the second spin echo from a peak position of the first spin echo;

measuring an amount of shift of a peak position of the third spin echo from the peak position of the first spin echo, or an amount of shift of a peak position of the fourth spin echo from the peak position of the second spin echo;

determining an amount of correction energy, based on the amount of shift, an amount of energy of the unit pulse, and the amount of deviation; and controlling the supply unit to supply the gradient magnetic field coil with the base pulse as the readout pulse during the actual scanning, and to supply the gradient magnetic field coil with a correction pulse of the determined amount of correction energy as the readout pulse during the actual scanning.

6. The method according to claim 5, further comprising:

controlling the supply unit to add the unit pulse to a front portion of the base pulse during a period of collecting the third spin echo or the fourth spin echo; and controlling the supply unit to add the correction pulse to the front portion of the base pulse during the period of collecting the spin echoes.

7. The method according to claim 5, further comprising:

controlling the supply unit to add the unit pulse to a rear portion of the base pulse during the period of collecting the spin echo which is included in the spin echoes and occurs immediately before one of the third and fourth spin echoes; and controlling the supply unit to add the correction pulse to the rear portion of the base pulse during the actual scanning.

8. The method according to claim 5, wherein: the first spin echo, the second spin echo and the third spin echo are collected as spin echoes generated firstly, secondly and thirdly, respectively.

9. A control method for use in a magnetic resonance imaging apparatus for performing imaging using a high-speed spin echo method, the apparatus including a gradient magnetic field coil which generates a gradient magnetic field for readout upon receiving a readout pulse, and a supply unit which supplies the readout pulse to the gradient magnetic field coil, comprising:

determining, before actual scanning for collecting data used for imaging, a level of a correction pulse used during the actual scanning, based on a spin echo acquired in the gradient magnetic field acquired using a base pulse as the readout pulse, and a spin echo acquired in the gradient magnetic field acquired using a pulse acquired by adding a unit pulse to the base pulse as the readout signal;

acquiring, during the actual scanning, a spin echo in the gradient magnetic field acquired using another pulse, said another pulse being used an the readout pulse and being acquired by adding the correction pulse of the determined level to the base pulse at a same temporal position with respect to an RF pulse as a temporal position of the unit pulse.

* * * * *